(12) United States Patent
Xu et al.

(10) Patent No.: US 11,558,064 B2
(45) Date of Patent: Jan. 17, 2023

(54) SAR ADC AND SAMPLING METHOD BASED ON SINGLE-CHANNEL TIME-INTERLEAVED-SAMPLING

(71) Applicants: NO.24 RESEARCH INSTITUTE OF CHINA ELECTRONICS TECHNOLOGY GROUP CORPORATION, Chongqing (CN); CHONGQING GIGACHIP TECHNOLOGY CO. LTD., Chongqing (CN)

(72) Inventors: Daiguo Xu, Chongqing (CN); Hequan Jiang, Chongqing (CN); Ruzhang Li, Chongqing (CN); Jianan Wang, Chongqing (CN); Guangbing Chen, Chongqing (CN); Yuxin Wang, Chongqing (CN); Dongbing Fu, Chongqing (CN); Liang Li, Chongqing (CN); Yan Wang, Chongqing (CN)

(73) Assignees: NO.24 RESEARCH INSTITUTE OF CHINA ELECTRONICS TECHNOLOGY GROUP CORPORATION, Chongqing (CN); CHONGQING GIGACHIP TECHNOLOGY CO. LTD., Chongqing (CN)

( * ) Notice: Subject to any disclaimer, the term of this patent is extended or adjusted under 35 U.S.C. 154(b) by 0 days.

(21) Appl. No.: 17/616,643

(22) PCT Filed: Jan. 7, 2020

(86) PCT No.: PCT/CN2020/070590
§ 371 (c)(1),
(2) Date: Dec. 4, 2021

(87) PCT Pub. No.: WO2020/244227
PCT Pub. Date: Dec. 10, 2020

(65) Prior Publication Data
US 2022/0247423 A1    Aug. 4, 2022

(30) Foreign Application Priority Data

Jun. 5, 2019 (CN) .......................... 201910485016.9

(51) Int. Cl.
*H03M 1/12* (2006.01)
*H03M 1/46* (2006.01)

(52) U.S. Cl.
CPC ......... *H03M 1/466* (2013.01); *H03M 1/1245* (2013.01); *H03M 1/462* (2013.01)

(58) Field of Classification Search
CPC .... H03M 1/468; H03M 1/069; H03M 1/1245; H03M 1/1215; H03M 1/129; H03M 1/38;
(Continued)

(56) References Cited

U.S. PATENT DOCUMENTS 9,742,424 B2 *  8/2017  Sharma ............... H03M 1/1245
10,020,816 B1 * 7/2018  Cleris ...................... H03K 5/24
(Continued)

FOREIGN PATENT DOCUMENTS

CN       104617955 A      5/2015
CN       105897272 A      8/2016
(Continued)

*Primary Examiner* — Linh V Nguyen
(74) *Attorney, Agent, or Firm* — Global IP Services; Tianhua Gu

(57) ABSTRACT

SAR ADC and sampling method based on single-channel TIS. The SAR ADC comprises: a capacitor array comprising a weight capacitor and a compensation capacitor, a first switch array, a second switch array, a channel switch group and a sampling switch; when in a sampling state: a lower plate of the weight capacitor is connected to an input voltage by means of the first switch array, and an upper plate of the (Continued)

capacitor array is connected to a common mode voltage by the sampling switch and the channel switch group; when in a successive approximation state: the lower plate of the weight capacitor is connected to a reference voltage by the second switch array. Input signals are sampled by using a unified to sampling switch, which solves the problem in the traditional technology that sampling moments are mismatched due to different sampling signals in each time-interleaved channel.

8 Claims, 3 Drawing Sheets

(58) Field of Classification Search
CPC .... H03M 1/00; H03M 1/0682; H03M 1/1023; H03M 1/1295; H03M 1/144; H03M 1/162; H03M 1/46; H03M 1/466; H03M 1/804; H03M 1/04; H03M 1/06; H03M 1/0675; H03M 1/0863; H03M 1/10; H03M 1/1033; H03M 1/1047; H03M 1/1061; H03M 1/1071; H03M 1/12; H03M 1/124; H03M 1/14; H03M 1/202; H03M 1/206; H03M 1/44; H03M 1/462

USPC .......... 341/118–120, 141, 155, 172
See application file for complete search history.

(56) References Cited

U.S. PATENT DOCUMENTS

| | | | |
|---|---|---|---|
| 10,284,145 B2* | 5/2019 | Sun | H03K 3/35613 |
| 10,707,889 B1* | 7/2020 | Bodnar | H03M 1/0863 |
| 10,763,878 B2* | 9/2020 | Ali | H03M 1/1033 |
| 11,082,056 B2* | 8/2021 | Bodnar | H03M 1/124 |
| 2004/0257256 A1* | 12/2004 | Leung | H03M 1/1057 |
| | | | 341/172 |
| 2012/0280841 A1* | 11/2012 | Wang | H03M 1/1295 |
| | | | 341/172 |
| 2014/0085122 A1* | 3/2014 | Jeon | H03M 1/0678 |
| | | | 341/158 |
| 2014/0354458 A1* | 12/2014 | Kakamu | H03M 1/206 |
| | | | 341/122 |
| 2019/0149162 A1 | 5/2019 | Lin et al. | |
| 2020/0228129 A1* | 7/2020 | Huang | H03M 1/0854 |

FOREIGN PATENT DOCUMENTS

| | | |
|---|---|---|
| CN | 109245768 A | 1/2019 |
| CN | 110138387 A | 8/2019 |

* cited by examiner

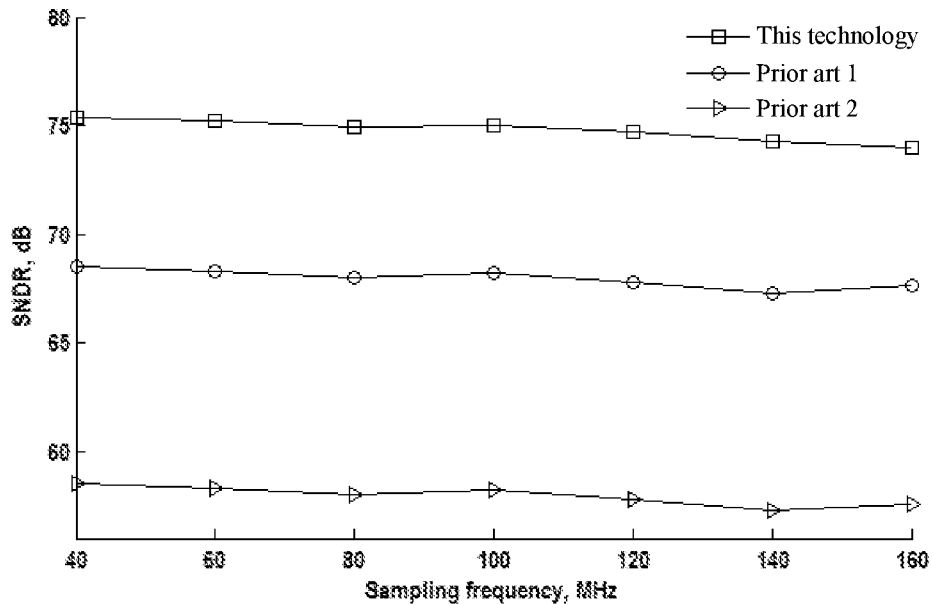

Fig. 5 providing N capacitor arrays, wherein each capacitor array comprises N-1 weight capacitors and a compensation capacitor, wherein the weight values of the capacitor array from high order to low order are respectively as follows: $2^{N-1}C, 2^{N-2}C,..., 2C, C$, wherein N is the number of channels

↓ when in a sampling state, connecting lower plates of the weight capacitors to an input voltage by means of N first switch arrays Sn(i)(i=1,2,..., N-2, N-1), connecting upper plates of the capacitor arrays to a common mode voltage by means of a sampling switch and a channel switch group K(i) (i=0,1,..., n-2, n-1); and connecting the channel switch group K(i) (i=0,1,..., n-2, n-1) in series with the sampling switch

↓ when in a successive approximation state, connecting the lower plates of the weight capacitors to a reference voltage by means of N second switch arrays S(i)(i=1,2,..., N-2, N-1)

Fig. 6

SAR ADC AND SAMPLING METHOD BASED ON SINGLE-CHANNEL TIME-INTERLEAVED-SAMPLING

CROSS REFERENCE TO RELATED PATENT APPLICATION

The present application is the US national stage of PCT/CN2020/070590 filed on 2020 Jan. 7, which claims the priority of the Chinese patent application No. 201910485016.9 filed on 2019 Jun. 5, which application is incorporated herein by reference.

FIELD OF TECHNOLOGY

The present disclosure relates to the technical field of electronic circuits, in particular to a successive-approximation-register (SAR) analog-to-digital converter (ADC) and sampling method based on single-channel time-interleaved-sampling (TIS).

BACKGROUND

In recent years, with further improvement of the performance of analog-to-digital converters, especially with the continuous development of integrated circuit process technology, the research on high-speed SAR ADCs has also become more and more in-depth. Bu it is also more and more difficult to design high-gain operational amplifiers in light of the ever evolving integrated circuit manufacturing process. Since no operational amplifiers are required in SAR ADCs, SAR ADCs have the intrinsic advantage of low power consumption, especially in the nano-scale process level, and therefore the speed of SAR ADCs has been further enhanced greatly. Therefore, high-speed SAR ADCs have become a research hotspot for ADCs.

At present, in the case where the speed of the existing single-channel SAR ADCs has already been substantially increased, the TIS technique is an effective solution in order to further increase the sampling speed of SAR ADCs. When the TIS technique is adopted, the sampling speed of the chip can be increased significantly with a mere linear increase in the area and power consumption of the whole chip. However, many shortcomings also exist. Take a SAR ADC structure based on N-channel TIS as an example, when the structure is in a sampling state, control signals S (i) (i=0, 1, ..., n−2, n−1) respectively control a sampling switch of each channel to sample an input signal, but if time intervals between the control signals S (i) (i=0, 1, ..., n−2, n−1) are not equal to each other, then sampling moments of the channels of the SARADC will be mismatched, and errors of mismatched sampling moments occurs, and such errors will vary along with factors such as the supply voltage, process and temperature, thereby making correction thereof more difficult or more costly.

SUMMARY

In view of the above shortcomings in the prior art, the present disclosure provides a SAR ADC and a sampling method based on single-channel TIS.

The SAR ADC based on single-channel TIS provided in the present disclosure at least includes:

N capacitor arrays, each comprising N−1 weight capacitors and a compensation capacitor, wherein the weight values of the capacitor array from high order to low order are respectively as follows: $2^{N-1}C, 2^{N-2}C, \ldots, 2C, C$, wherein N is the number of channels;

N first switch arrays, each comprising Sn(i)(i=1, 2, ..., N−2, N−1);

N second switch arrays, each comprising S(i)(i=1, 2, ..., N−2, N−1);

a channel switch group, comprising K(i) (i=0, 1, ..., n−2, n−1); and a sampling switch connected in series with the channel switch group;

When in a sampling state, lower plates of the weight capacitors are connected to an input voltage by means of the first switch arrays, and upper plates of the capacitor arrays are connected to a common mode voltage by means of the sampling switch and the channel switch group;

When in a successive approximation state, the lower plates of the weight capacitors are connected to a reference voltage by means of the second switch arrays.

Optionally, a comparator group that comprises N comparators is further provided, wherein the SAR ADC comprises N channels corresponding to the N comparators, and for each channel, one end of a channel switch in the channel switch group is connected to the common mode voltage by means of the sampling switch, and the other end of the channel switch is respectively connected to the upper plates of all the weight capacitors and the compensation capacitor in the channel and an input end of a comparator corresponding to the channel.

Optionally, each of the weight capacitors, except weight capacitors of the lowest order whose weight value is C, is divided into two equal sub capacitors of the same size.

Optionally, when in a sampling state, the sampling switch is turned on and off at a first sampling frequency, and the channel switches of the channel switch group are turned on and off at a second sampling frequency that is 1/N times the first sampling frequency, such that the N capacitor arrays in the N channels are connected to the common mode voltage one by one through their upper plates, and the N capacitor arrays are connected to the input voltage one by one through their lower plates, to complete sequential sampling of input signals.

Optionally, when the sampling state is finished, firstly the sampling switch is controlled to be disconnected, then the channel switch group and the first switch groups are controlled to be disconnected, and the second switch arrays are turned on, such that the lower plates of the two equal sub capacitors of each of the weight capacitors except the weight capacitors of the lowest order are connected to a positive reference and a negative reference respectively, and then the sampled voltages are saved in the upper plates of the capacitor arrays and the SAR ADC enters a successive approximation state, where according to comparison results of the comparators, the lower plates of corresponding weight capacitors are changed one by one from being connected to the common mode voltage to being connected to the positive reference or the negative reference, until the process of successive approximation is completed in sequence.

The present disclosure further includes a sampling method based on single-channel time-interleaved-sampling, including:

providing N capacitor arrays, wherein each capacitor array comprises N−1 weight capacitors and a compensation capacitor, wherein the weight values of the capacitor array from high order to low order are respectively as follows: 2N−1C, 2N−2C, ..., 2C, C, wherein N is the number of channels;

when in a sampling state, connecting lower plates of the weight capacitors to an input voltage by means of N first switch arrays Sn(i)(i=1, 2, . . . , N−2, N−1), connecting upper plates of the capacitor arrays to a common mode voltage by means of a sampling switch and a channel switch group K(i) (i=0, 1, . . . , n−2, n−1); and connecting the channel switch group K(i) (i=0, 1, . . . , n−2, n−1) in series with the sampling switch;

when in a successive approximation state, connecting the lower plates of the weight capacitors to a reference voltage by means of N second switch arrays S(i)(i=1, 2, . . . , N−2, N−1)

Optionally, in each channel corresponding to one of the capacitor arrays, one end of a channel switch in the channel switch group is connected to the common mode voltage by means of the sampling switch, and the other end is respectively connected to the upper plates of all the weight capacitors and the compensation capacitor in the channel and a negative input end of a corresponding comparator.

Optionally, each of the weight capacitors, except weight capacitors of the lowest order whose weight value is C, is divided into two equal sub capacitors of the same size.

Optionally, when in a sampling state, the sampling switch is turned on and off at a first sampling frequency, and the channel switches of the channel switch group are turned on and off at a second sampling frequency that is 1/N times the first sampling frequency, such that the N capacitor arrays in the N channels are connected to the common mode voltage one by one through their upper plates, and the N capacitor arrays are connected to the input voltage one by one through their lower plates, to complete sequential sampling of input signals.

Optionally, when the sampling state is finished, firstly the sampling switch is controlled to be disconnected, then the channel switch group and the first switch groups are controlled to be disconnected, and the second switch arrays are turned on, such that the lower plates of the two equal sub capacitors of each of the weight capacitors except the weight capacitors of the lowest order are connected to a positive reference and a negative reference respectively, and then the sampled voltages are saved in the upper plates of the capacitor arrays and the SAR ADC enters a successive approximation state, where according to comparison results of comparators, the lower plates of corresponding weight capacitors are changed one by one from being connected to the common mode voltage to being connected to the positive reference or the negative reference, until the process of successive approximation is completed in sequence.

The present disclosure has the following beneficial effects: input signals are sampled by using a unified sampling switch, which solves the problem in the traditional technology that sampling moments are mismatched due to different sampling signals in each of the time-interleaved channels, thereby improving the sampling precision and significantly reducing the complexity of a corresponding correction circuit. In the present disclosure, by using lower plates of capacitors for sampling, the sampling error caused by the charge injection effect is eliminated when the sampling switch is turned off, thereby further improving the sampling precision, allowing the use of a larger sampling switch, and further increasing the sampling speed of the ADC and providing better high-frequency performance compared with traditional techniques.

BRIEF DESCRIPTION OF THE DRAWINGS

FIG. 3($b$) is a partial diagram of a SAR ADC based on single-channel TIS in an embodiment of the present disclosure with the switch S disconnected and the switch K(i) connected.

FIG. 3($c$) is a partial diagram of a SAR ADC based on single-channel TIS in an embodiment of the present disclosure with both switch S and switch K(i) being disconnected.

FIG. 5 is a schematic diagram of comparison of a SAR ADC based on single-channel TIS in an embodiment of the present disclosure and traditional spurious-free dynamic range (SFDR) when the sampling frequency varies.

FIG. 6 is a flowchart showing a sampling method based on single-channel TIS in an embodiment of the present disclosure.

DETAILED DESCRIPTION

Embodiments of the present disclosure will be described below with specific examples, and other advantages and effects of the present disclosure will be readily apparent to those skilled in the art from the disclosure in the specification. The present disclosure may be carried out or applied in other different specific embodiments, and various modifications or changes may also be made to the details of the specification based on different ideas and applications without departing from the spirit of the present disclosure. It is to be noted that the following embodiments and features in the embodiments may be combined with each other if no conflicts will result.

It is to be noted that drawings provided in the following embodiments only schematically illustrate the basic idea of the present disclosure, so the drawings only show components related to the present disclosure, and are not necessarily drawn according to the numbers, shapes and sizes of the components in actual implementation; the forms, numbers and proportions of the components in actual implementation may be adjusted as needed; and the layout of the components may be more complex.

In the following description, a great number of details are explored to provide a more thorough explanation of embodiments of the present disclosure, however, it will be apparent to those skilled in the art that embodiments of the present disclosure can be implemented without these specific details, and in other embodiments, well-known structures and devices are shown in the form of block diagrams rather than in details, to avoid making embodiments of the present disclosure difficult to understand.

Figure 1:
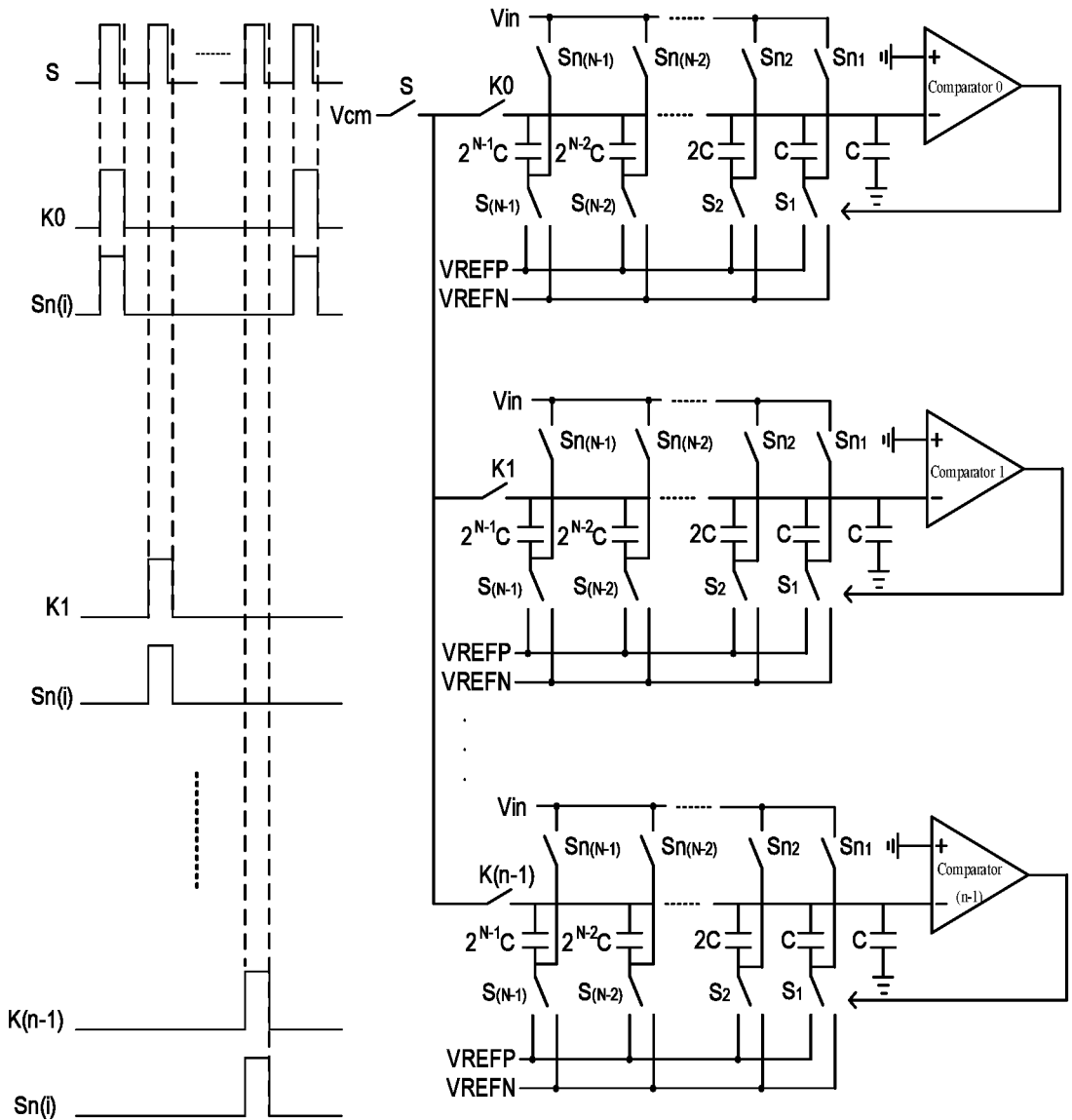
FIG. 1 is a schematic diagram of the timing sequence and principle of a SAR ADC based on single-channel TIS in an embodiment of the present disclosure.

As shown in FIG. 1, with a time-interleaved structure with N channels as an example, the SAR ADC based on single-channel TIS provided in the present disclosure at least includes:

N capacitor arrays, each including N−1 weight capacitors and a compensation capacitor, wherein the weight values of the capacitor array, from high order to low order, are respectively as follows: $2^{N-1}C, 2^{N-2}C, \ldots, 2C, C$, wherein N is the number of the total channels;

N first switch arrays, each including Sn(i)(i=1, 2, . . . , N−2, N−1);

N second switch arrays, each including S(i)(i=1, 2, . . . , N−2, N−1);

a channel switch group, including K(i) (i=0, 1, . . . , n−2, n−1); and a sampling switch S connected in series with the channel switch group;

when in a sampling state:

lower plates of the weight capacitors are connected to an input voltage by means of the first switch arrays, and upper plates of the capacitor arrays are connected to a common mode voltage Vcm by means of the sampling switch S and the channel switch group;

when in a successive approximation state:

lower plates of the weight capacitors are connected to a reference voltage by means of the second switch arrays.

In the present disclosure, the weight values of weight capacitors of each capacitor array from high order to low order are respectively as follows: $2^{N-1}C$, $2^{N-2}C$, . . . , 2C, C, and there are N−1 capacitors are in total for each capacitor array. In each capacitor array there is a compensation capacitor denoted as C. The weight values form an isometric series with a common ratio of 2. The lower plate of the compensation capacitor is grounded, and the upper plate of each capacitor in each capacitor array is connected to the common mode voltage Vcm by means of the sampling switch and a corresponding channel switch in the channel switch group in the corresponding channel, and the lower plate of each capacitor in each capacitor array is connected to the input voltage by means of a corresponding switch in the corresponding first switch array Sn(i) (i=1, 2, . . . , N−2, N−1), to acquire input signals.

Figure 2:
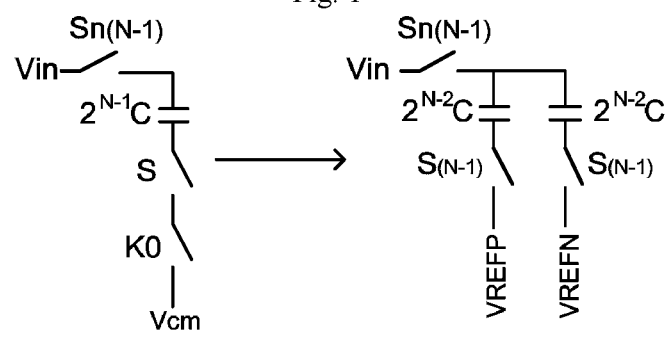
FIG. 2 is a schematic diagram of equal division of the highest-order weight capacitor of a SAR ADC based on single-channel TIS in an embodiment of the present disclosure.

In the present disclosure, each of the weight capacitors except the lowest-order weight capacitor C is equally divided into two capacitors of the same size. With the highest-order weight capacitor as an example, the equal division of a highest-order weight capacitor $2^{N-1}C$ is shown in FIG. 2: in the sampling state, the lower plate of the weight capacitor is connected to the input voltage (Vin) by means of the corresponding first switch array Sn(i)(i=1, 2, . . . , N−2, N−1), and the upper plate of the weight capacitor array is connected to the common mode voltage Vcm by means of the switch S and the channel switch group K(i) (i=0, 1, . . . , n−2, n−1) connected in series with the switch S; and in the successive approximation state, the lower plate of the weight capacitor is connected to the voltage reference (VREFP or VREFN) by means of the corresponding second switch array S(i)(i=1, 2, . . . , N−2, N−1).

Figure 3:
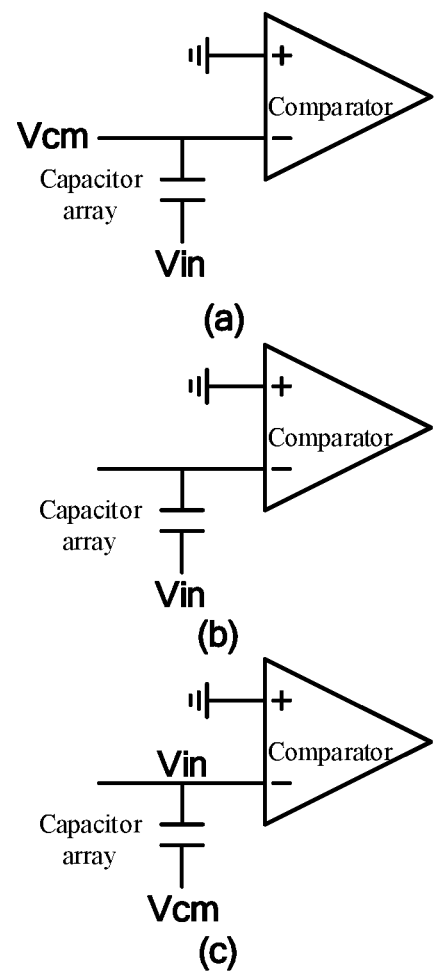
FIG. 3($a$) is a partial diagram of a sampling state of a SAR ADC based on single-channel TIS in an embodiment of the present disclosure.

In the present disclosure, when the N-channel SAR ADC based on single-channel TIS is in a sampling state, the sampling switch S connected to the common mode voltage Vcm is turned on and off at a first sampling frequency and the switches in the channel switch group K(i) (i=0, 1, . . . , n−2, n−1) are turned on and off sequentially, each at a second sampling frequency that is 1/N of the first sampling frequency, such that the N capacitor arrays are connected to the common mode voltage Vcm one by one through their upper plates, as shown in FIG. 3(a). At the same time, the N capacitor arrays are connected to the input signal Vin one by one through their lowers plates, therefore, the input signal Vin is sampled by the N capacitor arrays one by one.

In the present disclosure, when sampling has finished for each channel, the sampling switch S is firstly disconnected, as shown in FIG. 3(b). Thereafter, a channel switch K(i) that is connected in series with the sampling switch S and corresponding to the channel is disconnected, and the first switch array Sn(i) (i=1, 2, . . . , N−2, N−1) corresponding to the channel switch is also disconnected. Then the corresponding second switch array S(i) (i=1, 2, . . . , N−2, N−1) is connected to the reference voltage (VREFP and VREFN). Since the sampling switch S is disconnected first, it is known from the conservation of charge that the capacitor array corresponding to the channel has finished sampling at this time, and errors introduced during the disconnection process of the channel switch K(i) and the first switch array Sn(i) (i=1, 2, . . . , N−2, N−1) do not affect the sampling precision of the capacitor array.

In the present disclosure, lower plates of the two equal capacitors of each weight capacitor (except the ones of the lowest order) are connected to the positive reference VREFP and the negative reference VREFN (ground) respectively, which is equivalent to lower plates of the capacitor arrays being connected to the common mode voltage Vcm, as shown in FIG. 3(c), such that the sampled voltage is stored in the upper plates of the capacitor arrays. Thereafter, each channel enters the successive approximation state, and according to the comparison result of the comparator corresponding the channel, lower plates of corresponding weight capacitors change from being connected to the common mode voltage Vcm to being connected to the positive reference VREFP or the negative reference VREFN (ground) one by one, until the successive approximation process is completed.

Correspondingly, the present disclosure further provides a SAR ADC sampling method based on single-channel TIS. As shown in FIG. 6, the method includes:

Providing N capacitor arrays, wherein each capacitor array includes N−1 weight capacitors and a compensation capacitor, wherein the weight values of the capacitor array from high order to low order are respectively as follows: $2^{N-1}C$, $2^{N-2}C$, . . . , 2C, C, wherein N is the number of channels;

when in a sampling state:

lower plates of the weight capacitors are connected to an input voltage by means of N first switch arrays Sn(i)(i=1, 2, . . . , N−2, N−1), and upper plates of the capacitor arrays are connected to a common mode voltage by means of a sampling switch and a channel switch group K(i) (i=0, 1, . . . , n−2, n−1); and the channel switch group K(i) (i=0, 1, . . . , n−2, n−1) is connected in series with the sampling switch S;

when in a successive approximation state:

lower plates of the weight capacitors are connected to a reference voltage by means of N second switch arrays S(i)(i=1, 2, . . . , N−2, N−1).

In the present disclosure, the number of channel switches of the channel switch group is the same as the number of comparators of a comparator group of the SAR ADC, as shown in FIG. 1; in each channel, one end of the corresponding channel switch in the channel switch group is connected to the common mode voltage by means of the sampling switch, and the other end is respectively connected to the upper plates of all the weight capacitors and the compensation capacitor in the channel and a negative input end of the corresponding comparator. When in a sampling state, the sampling switch is turned on and off at a first sampling frequency, and switches of the channel switch group are turned on and off one by one at a second sampling frequency that is 1/N times the first sampling frequency, such that the N capacitor arrays in the N channels are connected to the common mode voltage through their upper plates one by one, and the N capacitor arrays are connected to the input voltage through their lower plates one by one, to complete the sequential sampling of input signals. When the sampling state is finished, firstly the sampling switch S is controlled to be disconnected, then the channel switch group and the first switch groups are controlled to be disconnected, and the second switch arrays are turned on, such that the lower plates of the two equal capacitors of each weight capacitor (except the ones of the lowest order) are connected to a positive reference and a negative reference respectively, and then sampled voltages are saved in the upper plates of the capacitor arrays and the structure enters a successive approximation state, where according to comparison results of the comparators, the lower plates of the corresponding weight capacitors are changed one by one from being connected to the common mode voltage to being connected to the positive reference or the negative reference, until the successive approximation is completed in sequence.

In each sampling process of the present disclosure, the input signal Vin is connected to the lower plates of the capacitor arrays, and the upper plates of the capacitor arrays are connected to the common mode voltage Vcm by means of the switches S and K(i) (i=0, 1, ..., n−2, n−1). Through the sampling method, the sampling of each channel of the N-channel SAR ADC can be finished in sequence through controlling the switch S and switch K(i) (i=0, 1, ..., n−2, n−1) to be turned on, so as to achieve the purpose of time-interleaved sampling of N-channel SAR ADCs. After each sampling is finished, as soon as the switch S is disconnected, it means that the sampling process of a single channel of the SAR ADC is finished. Since all channels of the SAR ADC are connected to the same sampling switch S, by adopting the time-interleaved sampling method in the present disclosure, sampling errors caused by the mismatch of sampling moments of each single channel in the traditional time-interleaved sampling technique will not occur.

At the same time, since the present disclosure chooses to sample the lower plates of the capacitor arrays, as soon as the switch S is disconnected, it means that the sampling process of a channel of the N-channel SAR ADC is finished, and capacitor injection errors introduced by the disconnection of the switch S is of a fixed value for all channels, which will not affect the dynamic performance of the whole ADC. It can be known from the conservation of charge that the charge injection generated from K(i) (i=0, 1, ..., n−2, n−1) and Sn(i) (i=1, 2, ..., N−2, N−1) will not affect the precision of the whole ADC. The above advantages allow the switches S, K(i) (i=0, 1, ..., n−2, n−1) and Sn(i) (i=1, 2, ..., N−2, N−1) to be designed with larger sizes and smaller resistance, thereby satisfying the requirement of high-speed sampling.

Figure 4:
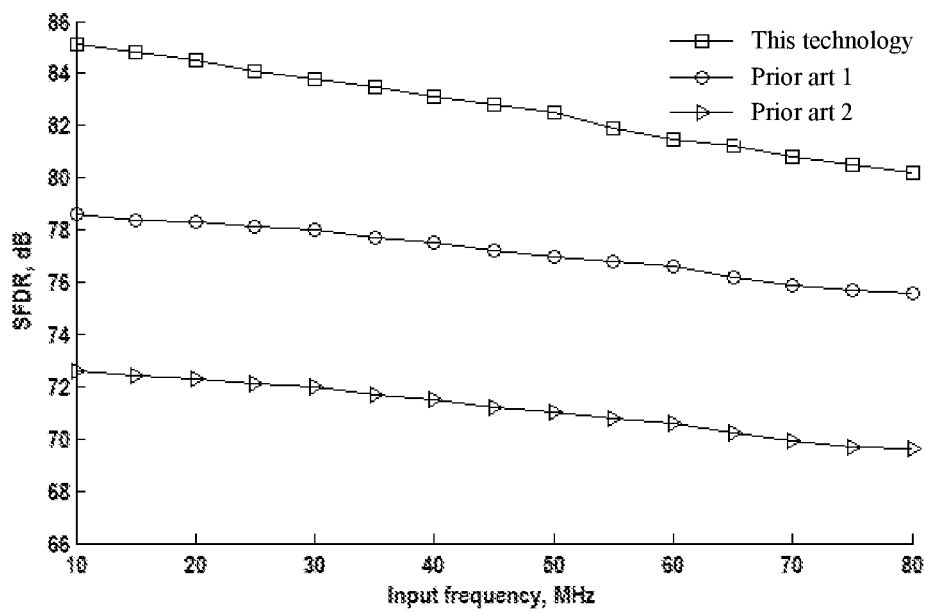
FIG. 4 is a schematic diagram of comparison of a SAR ADC based on single-channel TIS in an embodiment of the present disclosure and traditional spurious-free dynamic range (SFDR) when the input signal frequency varies.

As shown in FIG. 4 and FIG. 5, traditional time-interleaved techniques and the sampling method of the present example are adopted respectively to design corresponding ADCs with a sampling rate of 14-bit 250 MHz and utilizing 4-channel TIS technology by using 65 nm CMOS process, wherein each single channel is an SAR ADC with a sampling rate of a 14-bit 62.5 MHz. The unit capacitance takes the value of 3 fF. The comparison of the spurious-free dynamic range (SFDR) of the present technology and the traditional technology while the input signal frequency varies is as shown in FIG. 4, and it can be known from FIG. 4 that, after adopting the sampling method in the present disclosure, the spurious-free dynamic range (SFDR) of the ADC is improved by at least 4.5 dB. The comparison of the signal noise distortion ratio (SNDR) of the sampling method in the present disclosure and the traditional technology while the sampling frequency varies is as shown in FIG. 5, and it can be known from FIG. 5 that, after adopting the sampling method of the present disclosure, the signal noise distortion ratio (SNDR) of the ADC is improved by at least 5.5 dB.

In the corresponding drawings of the above embodiments, the connecting lines may indicate the connection relationship between individual components, to indicate more constituent signal paths and/or some lines with arrows at one or more ends to indicate the main information flow direction, the connecting lines serve as an identifier, not as a limitation on the solution itself, but in combination with one or more exemplary embodiments, these lines are used to help more easily connect circuits or logic units, and any represented signal (as determined by design needs or preferences) may actually include one or more signals that can be transmitted in either direction and can be implemented in any appropriate type of signaling solution.

In the above embodiments, references to "the present disclosure", "an embodiment", "another embodiment", or "other embodiments" in the specification indicate that the particular feature, structure, or characteristic illustrated in combination with the embodiments is included in at least some, but not necessarily all, of the embodiments. Multiple occurrences of "the present disclosure", "an embodiment", or "another embodiment" do not necessarily all refer to the same embodiment. If the specification describes a part, feature, structure, or characteristic that "may", "might", or "can" be included, then the particular part, feature, structure, or characteristic "may", "might", or "can" be included, then the particular part, feature, structure, or characteristic is not required to be included. If the specification or claims refer to "one" element, it does not mean that there is only one element. If the specification or claims refer to "an additional" element, the existence of more than one additional element is not excluded.

Each embodiment in the present specification is described in a progressive manner, and the same and similar parts of each embodiment can be referenced with each other, and each embodiment focuses on the differences from other embodiments. In particular, for the system embodiment, since it is basically similar to the method embodiment, so the description is relatively simple, and for the relevant parts, please refer to part of the description of the method embodiment.

The above embodiments are merely illustrative of the principles of the present disclosure and effects thereof, and are not intended to limit the present disclosure. Any person skilled in the art can modify or change the above embodiments without departing from the spirit and scope of the present disclosure. Therefore, all the equivalent modifications or changes made by those skilled in the art without departing from the spirit and technical ideas disclosed in the present disclosure are still encompassed within the scope of the claims of the present disclosure.

What is claimed is:

1. A successive-approximation-register (SAR) analog-to-digital converter (ADC) based on single-channel time-interleaved-sampling, comprising:
   N capacitor arrays, each comprising N−1 weight capacitors and a compensation capacitor, wherein the weight values of the capacitor array from high order to low order are respectively as follows: $2^{N-1}C$, $2^{N-2}C$, 2C, C, wherein N is the number of channels;
   N first switch arrays, each comprising Sn(i)(i=1,2, ..., N−2, N−1);
   N second switch arrays, each comprising S(i)(i=1, 2, ..., N−2, N−1);
   a channel switch group, comprising K(i) (i=0,1, ..., n−2, n−1); and a sampling switch connected in series with the channel switch group;

wherein when in a sampling state, lower plates of the weight capacitors are connected to an input voltage by means of the first switch arrays, and upper plates of the capacitor arrays are connected to a common mode voltage by means of the sampling switch and the channel switch group;

wherein when in a successive approximation state, the lower plates of the weight capacitors are connected to a reference voltage by means of the second switch arrays;

wherein when in a sampling state, the sampling switch is turned on and off at a first sampling frequency, and the channel switches of the channel switch group are turned on and off at a second sampling frequency that is 1/N times the first sampling frequency, such that the N capacitor arrays in the N channels are connected to the common mode voltage one by one through their upper plates, and the N capacitor arrays are connected to the input voltage one by one through their lower plates, to complete sequential sampling of input signals.

2. The SAR ADC based on single-channel time-interleaved-sampling according to claim 1, further comprising a comparator group that comprises N comparators, wherein the SAR ADC comprises N channels corresponding to the N comparators, and for each channel, one end of a channel switch in the channel switch group is connected to the common mode voltage by means of the sampling switch, and the other end of the channel switch is respectively connected to the upper plates of all the weight capacitors and the compensation capacitor in the channel and an input end of a comparator corresponding to the channel.

3. The SAR ADC based on single-channel time-interleaved-sampling according to claim 2, wherein each of the weight capacitors, except weight capacitors of the lowest order whose weight value is C, is divided into two equal sub capacitors of the same size.

4. The SAR ADC based on single-channel time-interleaved-sampling according to claim 3, wherein when the sampling state is finished, firstly the sampling switch is controlled to be disconnected, then the channel switch group and the first switch groups are controlled to be disconnected, and the second switch arrays are turned on, such that the lower plates of the two equal sub capacitors of each of the weight capacitors except the weight capacitors of the lowest order are connected to a positive reference and a negative reference respectively, and then the sampled voltages are saved in the upper plates of the capacitor arrays and the SAR ADC enters a successive approximation state, where according to comparison results of the comparators, the lower plates of corresponding weight capacitors are changed one by one from being connected to the common mode voltage to being connected to the positive reference or the negative reference, until the process of successive approximation is completed in sequence.

5. A sampling method based on single-channel time-interleaved-sampling, comprising:

providing N capacitor arrays, wherein each capacitor array comprises N−1 weight capacitors and a compensation capacitor, wherein the weight values of the capacitor array from high order to low order are respectively as follows: $2^{N-1}C, 2^{N-2}C, \ldots, 2C, C$, wherein N is the number of channels;

when in a sampling state, connecting lower plates of the weight capacitors to an input voltage by means of N first switch arrays Sn(i)(i=1,2, . . . , N−2, N−1), connecting upper plates of the capacitor arrays to a common mode voltage by means of a sampling switch and a channel switch group K(i) (i=0,1, . . . , n−2, n−1); and connecting the channel switch group K(i) (i=0,1, . . . , n−2, n−1) in series with the sampling switch;

when in a successive approximation state, connecting the lower plates of the weight capacitors to a reference voltage by means of N second switch arrays S(i) (i=1,2, . . . , N−2, N−1), wherein when in a sampling state, the sampling switch is turned on and off at a first sampling frequency, and the channel switches of the channel switch group are turned on and off at a second sampling frequency that is 1/N times the first sampling frequency, such that the N capacitor arrays in the N channels are connected to the common mode voltage one by one through their upper plates, and the N capacitor arrays are connected to the input voltage one by one through their lower plates, to complete sequential sampling of input signals.

6. The sampling method based on single-channel time-interleaved-sampling according to claim 5, wherein in each channel corresponding to one of the capacitor arrays, one end of a channel switch in the channel switch group is connected to the common mode voltage by means of the sampling switch, and the other end is respectively connected to the upper plates of all the weight capacitors and the compensation capacitor in the channel and a negative input end of a corresponding comparator.

7. The sampling method based on single-channel time-interleaved-sampling according to claim 6, wherein each of the weight capacitors, except weight capacitors of the lowest order whose weight value is C, is divided into two equal sub capacitors of the same size.

8. The sampling method based on single-channel time-interleaved-sampling according to claim 7, wherein when the sampling state is finished, firstly the sampling switch is controlled to be disconnected, then the channel switch group and the first switch groups are controlled to be disconnected, and the second switch arrays are turned on, such that the lower plates of the two equal sub capacitors of each of the weight capacitors except the weight capacitors of the lowest order are connected to a positive reference and a negative reference respectively, and then the sampled voltages are saved in the upper plates of the capacitor arrays and the SAR ADC enters a successive approximation state, where according to comparison results of comparators, the lower plates of corresponding weight capacitors are changed one by one from being connected to the common mode voltage to being connected to the positive reference or the negative reference, until the process of successive approximation is completed in sequence.

* * * * *